(12) United States Patent
Matsumoto et al.

(10) Patent No.: US 6,630,874 B2
(45) Date of Patent: Oct. 7, 2003

(54) PHASE SHIFTER AND COMMUNICATION DEVICE USING THE SAME

(75) Inventors: Mitsuhiro Matsumoto, Shiga-ken (JP); Kazuhiro Iida, Shiga-ken (JP); Koji Tanaka, Takefu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 201 days.

(21) Appl. No.: 09/844,569

(22) Filed: Apr. 27, 2001

(65) Prior Publication Data

US 2002/0024406 A1 Feb. 28, 2002

(30) Foreign Application Priority Data

Apr. 28, 2000 (JP) ........................... 2000-129691

(51) Int. Cl.$^7$ ................................................ H01P 1/185
(52) U.S. Cl. ........................................ 333/164; 333/156
(58) Field of Search .................................. 333/164, 156

(56) References Cited

U.S. PATENT DOCUMENTS

| | | | | |
|---|---|---|---|---|
| 4,638,269 A | * | 1/1987 | Dawson et al. | 333/164 |
| 4,764,740 A | * | 8/1988 | Meyer | 333/164 |

FOREIGN PATENT DOCUMENTS

| | | |
|---|---|---|
| JP | 02-268001 | 11/1990 |
| JP | 04-047801 | 2/1992 |
| JP | 04-207512 | 7/1992 |
| JP | 06/132702 | 5/1994 |
| JP | 06-334462 | 12/1994 |
| JP | 08-330801 | 12/1996 |
| JP | 09/232802 | 9/1997 |
| JP | 10-051209 | 2/1998 |
| JP | 10-256805 | 9/1998 |

OTHER PUBLICATIONS

Hardin, R.H. et al; "Electronically-variable phase shifters utilizing variable capacitance diodes"; Proceeding of IRE, pp 944–945, May 1960.*

* cited by examiner

Primary Examiner—Benny Lee
(74) Attorney, Agent, or Firm—Keating & Bennett, LLP

(57) ABSTRACT

A phase shifter includes a comb-line defined by first and second transmission lines that are electromagnetically coupled with each other and a plurality of variable-capacitance diodes connected to the first and second transmission lines defining the comb-line. In the phase shifter, one end of the first transmission line is connected to an input terminal, one end of the second transmission line is connected to an output terminal, and the variable-capacitance diodes are connected between the other ends of the first and second transmission lines and the corresponding grounds.

8 Claims, 8 Drawing Sheets

PHASE SHIFTER AND COMMUNICATION DEVICE USING THE SAME

BACKGROUND OF THE INVENTION

1. Field of the Invention

The present invention relates to phase shifters and wireless communication devices, and more particularly, the present invention relates to a phase shifter used in a microwave band or a millimeter wave band and a wireless communication device using the same.

2. Description of the Related Art

Generally, a base station, which is a wireless communication device, includes a phase shifter for adjusting a phase to achieve a desired one in order to enable a common-amplification amplifier to continuously change the phase of a high-frequency signal.

FIG. 10 shows a conventional phase shifter used in a microwave band. A phase shifter 70 includes an input terminal 71, an output terminal 72, control terminals 73, 74, 75, 76 for controlling a transmission line through which the high-frequency signal passes, transmission lines 77 and 78 having different passing phases, and field-effect transistors (hereinafter, referred to as FET) 79, 80, 81, 82 for switching between conduction and insulation across the input and the output.

In the conventional phase-shifter 70, applying 0V to the control terminals 73 and 74 of the FETs 79 and 80 turns on the FETs 79 and 80. Applying a voltage, which is a pinch-off voltage or below, e.g. −5V, to the control terminals 75 and 76 of the FETs 81 and 82 turns off the FETs 81 and 82. This allows the high-frequency signal input from the input terminal 71 to pass the transmission line 77. On the other hand, turning off the FETs 79 and 80 and turning on the FETs 81 and 82 allow the high-frequency signal to pass the transmission line 78. When the signal passes, since there is phase difference between the transmission line 77 and the transmission line 78, a phase difference is generated between the two states. By controlling the phase in this manner, the phase of the high-frequency signal is obtained.

However, there is a problem in that, since the foregoing conventional phase shifter has a plurality of transmission lines having different phases that are switched via FETs, the phase cannot be controlled in a continuously variable manner.

In addition, since FETs included in each of the transmission paths are required to vary the multiple phases, the number of components is increased. This also causes problems such as complications in the construction of the phase shifter itself, an increase in the size of the phase shifter, and an increase in the manufacturing cost of the phase shifter.

SUMMARY OF THE INVENTION

In order to overcome the problems described above, preferred embodiments of the present invention provide a portable phase shifter as well as a communication device for accurately and easily controlling the phase in a continuously variable manner.

According to a first preferred embodiment of the present invention, a phase shifter includes a comb-line defined by first and second transmission lines electromagnetically coupled with each other and a plurality of variable-capacitance diodes respectively connected to the first and second transmission lines defining the comb-line wherein one end of the first transmission line is connected to an input terminal of the phase shifter, one end of the second transmission line is connected to an output terminal of the phase shifter, and the variable-capacitance diodes are connected between the other ends of the first and second transmission lines and the corresponding grounds.

In the phase shifter according to the first preferred embodiment of the present invention, since variable-capacitance diodes are connected between the other ends of first and second transmission lines constituting a comb-line and the corresponding grounds, the capacitances of these variable-capacitance diodes can be variably controlled by controlling the voltages applied to these variable-capacitance diodes. As a result of this, the impedances of the variable-capacitance diodes can be controlled in a variable manner and the phase of the high-frequency signal transmitted from the input terminal to the output terminal of the phase shifter via the comb-line can be controlled in a variable manner.

Since the comb-line and the variable-capacitance diodes constitute the phase shifter, the construction of the phase shifter is greatly simplified. As a result of this, the phase shifter can be miniaturized and, in addition, the manufacturing cost thereof can be decreased.

The variable-capacitance diodes may be connected in parallel with resistors.

Since the variable-capacitance diodes are connected in parallel with resistors, the phase can be varied while the reflection coefficient is maintained. Therefore, in the phase shifter, the phase can be varied while the change in the amplitude can be prevented.

A phase shifter may further include a ceramic substrate obtained by laminating a ceramic plurality of sheet layers, wherein a strip electrode, defining the comb-line, is incorporated in the ceramic substrate and the variable-capacitance diodes are mounted in the ceramic substrate.

Since the ceramic substrate obtained by laminating a plurality of ceramic sheet layers is provided and copper strip electrodes constituting the comb-line are incorporated in the ceramic substrate, a "wavelength reduction effect" caused by the ceramic substrate and reduction in loss due to use of copper allow the phase shifter to be adapted for use in a high-frequency band of 1 GHz or above.

According to a second preferred embodiment of the present invention, a phase shifter includes a first comb-line defined by first and second transmission lines electromagnetically coupled with each other, a second comb-line defined by third and fourth transmission lines electromagnetically coupled with each other, and variable-capacitance diodes each connected to the third and fourth transmission lines defining the second comb-line wherein one end of the first transmission line is connected to an input terminal, one end of the second transmission line is connected to an output terminal, the variable-capacitance diodes are connected between ends of the third and fourth transmission lines and the corresponding grounds, and the other end of the first transmission line and the other end of the second transmission line are connected to the other end of the third transmission line and the other end of the fourth transmission line, respectively.

Since the variable-capacitance diodes are connected between the other ends of the third and fourth transmission lines constituting the second comb-line and the corresponding grounds, the capacitances of these variable-capacitance diodes can be variably controlled by controlling the voltages applied to the variable-capacitance diodes. As a result of this, the impedances of the variable-capacitance diodes can be variably controlled and the phase of the high-frequency signal transmitted from the input terminal to the output terminal of the phase shifter via the first and second comb-lines can be variably controlled.

Since the first and second comb-lines and the variable-capacitance diodes constitute the phase shifter, the construction of the phase shifter is simplified. As a result of this, the phase shifter is greatly miniaturized and, in addition, the manufacturing cost thereof is greatly decreased.

In this phase shifter, the variable-capacitance diodes may be connected in parallel with resistors.

Since the variable-capacitance diodes are connected in parallel with the resistors, the phase can be varied while the reflection coefficient is maintained. Therefore, in the phase shifter, the phase can be varied while the change in the amplitude is prevented.

A phase shifter may further include a ceramic substrate obtained by laminating a plurality of sheet layers including ceramic material, wherein, strip electrodes, defining the first and second comb-lines, are incorporated in the ceramic substrate and the variable-capacitance diodes are mounted in the ceramic substrate.

Since the ceramic substrate obtained by laminating a plurality of ceramic sheet layers is provided and the copper strip electrodes constituting the comb-line are incorporated in the ceramic substrate. Therefore, the "wavelength reduction effect" caused by the ceramic substrate and the reduction in loss due to use of copper allow the phase shifter to be adapted for use in the high-frequency band of 1 GHz or above.

Since the first and second comb-lines are arranged so as to be overlapped in the vertical direction of the ceramic substrate, the mounting area of the phase shifter is greatly decreased.

According to a third preferred embodiment of the present invention, a wireless device includes a phase shifter according to any one of the above preferred embodiments and related modifications.

Since the portable phase shifter is used, a small base station having a preferable transmission characteristic can be realized.

Other features, elements, characteristics and advantages of the present invention will become apparent from the following detailed description of preferred embodiments of the present invention with reference to the attached drawings.

DETAILED DESCRIPTION OF PREFERRED EMBODIMENTS

Hereinafter, preferred embodiments according to the present invention are described with reference to drawings.

Figure 1:
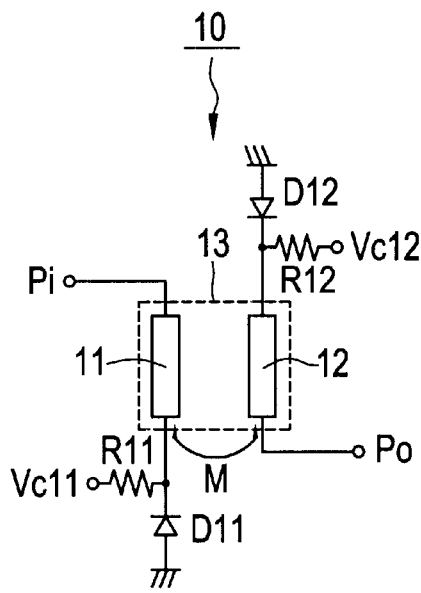
FIG. 1 is a circuit diagram of a first preferred embodiment according to a phase shifter of the present invention.

FIG. 1 is a diagram illustrating the construction of a first preferred embodiment according to a phase shifter of the present invention. A phase shifter 10 includes a comb-line 13 defined by first and second transmission lines 11 and 12 electromagnetically coupled with each other with a degree of coupling M, varicap diodes D11 and D12, which are variable-capacitance diodes, connected to the first and second transmission lines, respectively, and resistors R11 and R12.

Ends of the first and second transmission lines 11 and 12 defining the comb-line 13 are connected to an input terminal $P_i$ and an output terminal Po, respectively. The varicap diode D11 is connected between the other end of the first transmission line 11, defining the comb-line 13, and the ground so that the cathode thereof is on the other end side of the first transmission line 11. A node between the other end of the first transmission line 11 and the cathode of the diode D11 is connected via the resistor R11 to a control terminal $V_{c11}$.

Furthermore, the varicap diode D12 is connected between the other terminal of the second transmission line 12, defining the comb-line 13, and the ground so that the cathode thereof is on the other terminal side of the second transmission line 12. A node between the other terminal of the second transmission line 12 and the cathode of the varicap diode D12 is connected via the resistor R12 to a control terminal $V_{c12}$.

The operation of the phase shifter 10 having the above-described circuit construction will now described. A high-frequency signal is input from the input terminal $P_i$, transmitted via the comb-line 13 to the varicap diodes D11 and D12, and reflected at the cathodes of the varicap diodes D11 and D12. Most of the reflected high-frequency signal is output from the output terminal $P_o$.

At this time, the phases of the high-frequency signal reflected at the cathodes of the varicap diodes D11 and D12 are varied in the accordance with the capacitances of the varicap diodes D11 and D12 varied in response to the applied voltages applied from the control terminals $V_{c11}$ and $V_{c12}$. The high-frequency signal having a phase that is varied and synthesized is output from the output terminal $P_o$.

That is, when positive voltages, which are the voltages applied from the control terminals $V_{c11}$ and $V_{c12}$ to the varicap diodes D11 and D12, is gradually increased from 0V, the capacitances of the varicap diodes D11 and D12 are gradually increased. As a result of this, the impedances of the varicap diodes D11 and D12 are varied, causing the phase of the high-frequency signal transmitted via the comb-line 13 from the input terminal $P_i$ to the output terminal $P_o$ of the phase shifter 10 to gradually change from about 0° to about 180°.

Therefore, by controlling the voltages applied from the control terminals $V_{c11}$ and $V_{c12}$ in a variable manner, the impedances of the varicap diodes D11 and D12 can be controlled in a variable manner. As a result of this, the phase of the high-frequency signal transmitted from the input terminal $P_i$ of the phase shifter 10 to the output terminal $P_o$ via the comb-line 13 can be controlled in a variable manner.

Figure 2:
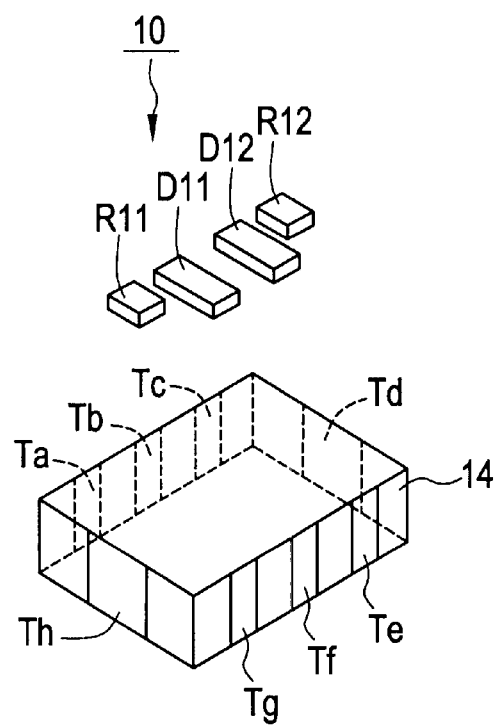
FIG. 2 is a partially exploded perspective view of the phase shifter in FIG. 1.
Figure 3A:
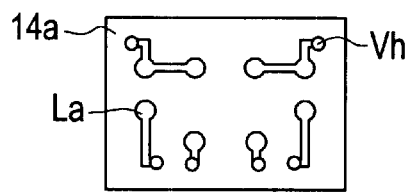
(FIGS. 3A, 3B, 3C, 3D, 3E and 3F are top views of first to fifth sheet layers and a bottom view of the fifth sheet layer, respectively, which constitute a ceramic substrate of the phase shifter in FIG. 2.
Figure 3B:
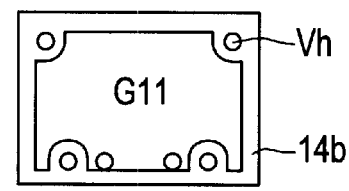
Figure 3C:
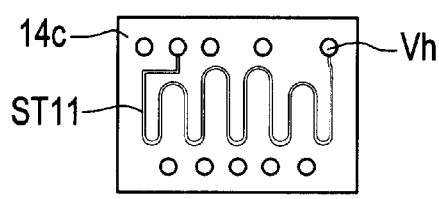
Figure 3D:
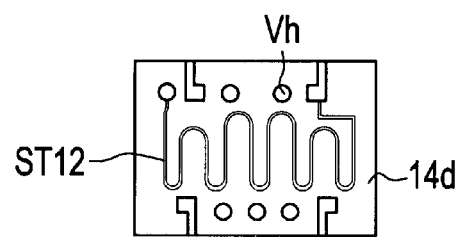
Figure 3E:
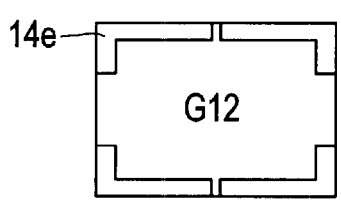
Figure 3F:
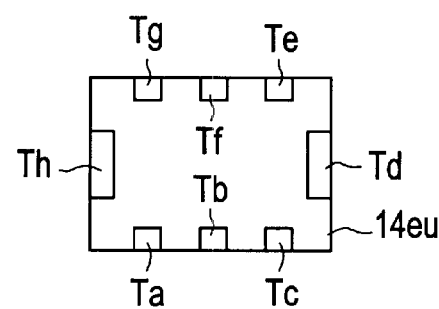

FIG. 2 is a partly exploded perspective view of the phase shifter in FIG. 1. A phase shifter 10 is provided with a ceramic substrate 14 having the first and second transmission lines 11 and 12, defining the comb-line 13, incorporated therein, but not shown.

The varicap diodes D11 and D12, and the resistors R11 and R12 are mounted on the top surface of the ceramic substrate 14. External terminals $T_a$, $T_b$, $T_c$, $T_d$, $T_e$, $T_f$, $T_g$ and $T_h$ are arranged to extend from corresponding side surfaces to the bottom surface of the ceramic substrate 14.

At this time, the external terminals $T_a$, $T_c$, $T_e$, and $T_g$ function as the input terminal $P_i$, output terminal $P_o$, control terminal $V_{c12}$, and control terminal $V_{c11}$, respectively, and the external terminals $T_b$, $T_d$, $T_f$, and $T_h$ function as the ground terminals.

FIGS. 3A to 3F are top and bottom views of each sheet layer constitutes the ceramic substrate of the phase shifter in FIG. 2. The ceramic substrate 14 shown in FIG. 2 is defined by sequentially laminating first to fifth sheet layers 14a, 14b, 14c, 14d, and 14e including low-temperature baked ceramic preferably having principal components of barium oxide, aluminum oxide, and silica, which are burnable between e.g., about 850° and about 1000°, and baking the layers.

A land $L_a$ is provided for implementing the varicap diodes D11 and D12 and the resistors R11 and R12 on the top surface of the first sheet layer 14a. Ground electrodes G11 and G12 are provided on the top surfaces of the second and fifth sheet layers 14b and 14e, respectively.

Furthermore, strip-line electrodes ST11 and ST12 are disposed on the top surfaces of the third and fourth sheet layers 14c and 14d, respectively. The external terminals $T_a$ to $T_h$ are provided on the bottom surface (marked with "14eu" in FIG. 3F) of the fifth sheet layer. In addition, the first to fourth sheet layers 14a to 14d are provided with via-hole electrodes $V_h$ so that the via-hole electrodes $V_h$ penetrate through each of the sheet layers 14a to 14d.

At this time, the strip-line electrode ST11 constitutes the first transmission line 11 defining the comb-line 13, and the strip-line electrode ST12 constitutes the second transmission line 12 defining the comb-line 13. The first and second transmission lines 11 and 12 and the varicap diodes D11 and D12 are connected by the via-hole electrodes $V_h$ inside the ceramic substrate 14.

According to the phase shifter in the first preferred embodiment, since the varicap diodes are connected between the other ends of the first and second transmission lines defining the comb-line and the ground, variable control of the applied voltage applied to these varicap diodes enables the capacitances of these varicap diodes to be controlled in a variable manner. Consequently, the impedances of the varicap diodes can be controlled in a variable manner. This can realize variable control of the phase of the high-frequency signal transmitted via the comb-line from the input terminal to the output terminal of the phase shifter.

Since the comb-line and the varicap diodes constitute the phase shifter, the construction of the phase shifter is greatly simplified. As a result of this, miniaturization and reduction in the manufacturing cost of the phase shifter are achieved.

Furthermore, since the ceramic substrate obtained by laminating a plurality of ceramic sheet layers is provided and the copper strip electrodes constituting the comb-line are incorporated therein, a "wavelength reduction effect" caused by the ceramic substrate and reduction in loss due to use of copper allow the phase shifter to be adapted for use in a high frequency band of 1 GHz or above.

Figure 4:
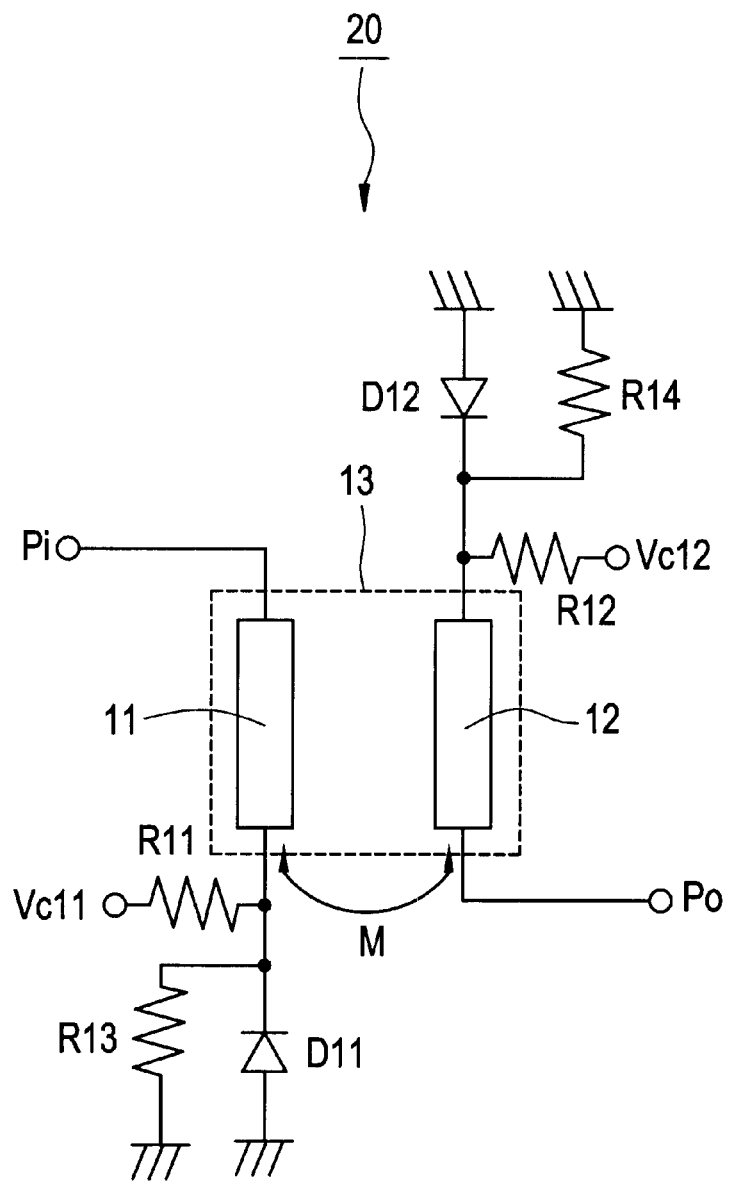
FIG. 4 is a circuit diagram of a second preferred embodiment according to the phase shifter of the present invention.

FIG. 4 is a circuit diagram of a second preferred embodiment according to the phase shifter of the present invention. A phase shifter 20 differs from the phase shifter 10 (FIG. 1) in the first preferred embodiment in that resistors R13 and R14 are connected in parallel with the varicap diodes D11 and D12, respectively. The remaining elements of the phase shifter 20 are the same as the elements of the phase shifter 10 shown in FIG. 1. The description of the remaining elements of the phase shifter 10 shown in FIG. 4 is provided in the description of the phase shifter 10 shown in FIG. 1.

That is, a parallel circuit of the varicap diode D11 and the resistor R13 and a parallel circuit of the varicap diode D12 and the resistor R14 are connected between the other ends of the first and second transmission lines 11 and 12 defining the comb-line 13 and the corresponding grounds.

According to the phase shifter of the second preferred embodiment, since the varicap diodes are connected in parallel with the resistors, the phase can be varied while the reflection coefficient is maintained at a constant level. Therefore, in the phase shifter, the phase can be varied while the change in the amplitude is prevented.

Figure 5:
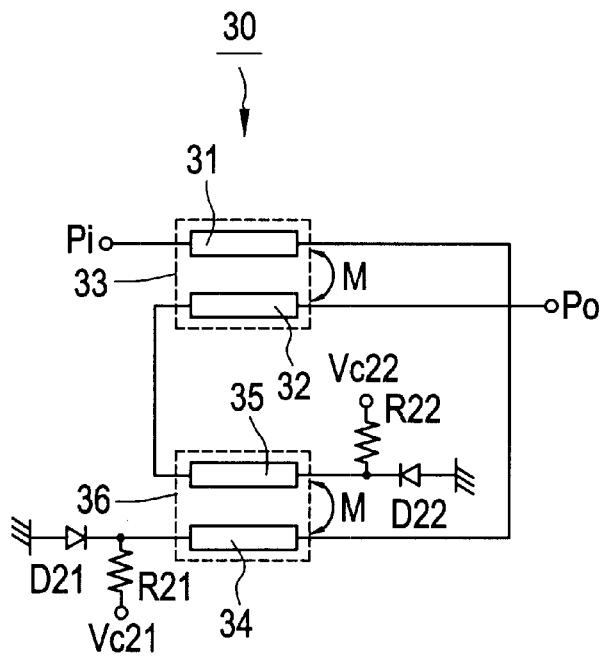
FIG. 5 is a circuit diagram of a third preferred embodiment according to the phase shifter of the present invention.

FIG. 5 is a circuit diagram of a third preferred embodiment according to the phase shifter of the present invention. A phase shifter 30 includes a first comb-line 33 having first and second transmission lines 31 and 32 electromagnetically coupled with each other with a degree of coupling M, a second comb-line 36 having third and fourth transmission lines 34 and 35 electromagnetically coupled with each other with the degree of coupling M, and varicap diodes D21 and D22 which are variable-capacitance diodes connected to the third and fourth transmission lines 34 and 35 forming the second comb-line 36.

The input terminal $P_i$ and output terminal $P_o$ are connected to corresponding ends of the first and second transmission lines 31 and 32 defining the first comb-line 33. The varicap diode D21 is connected between one end of the third transmission line 34 defining the second comb-line 36 and the ground so that the cathode thereof is on the end side of the third transmission line 34. A node between one end of the third transmission line 34 and the varicap diode D21 is connected via a resistor R21 to a control terminal $V_{c21}$.

Furthermore, the varicap diode D22 is connected between one end of the fourth transmission line 35 defining the second comb-line 36 and the ground so that the cathode thereof is on one end side of the fourth transmission line 35. A node between one end of the fourth transmission line 35 and the varicap diode D22 is connected via a resistor R22 to a control terminal $V_{c22}$.

The other end of the first transmission line 31 defining the first comb-line 33 and the other end of the third transmission line 34 defining the second comb-line 36 are connected. The other end of the second transmission line 32 defining the first comb-line 33 and the other end of the fourth transmission line 35 defining the second comb-line 36 are connected.

Figure 6:
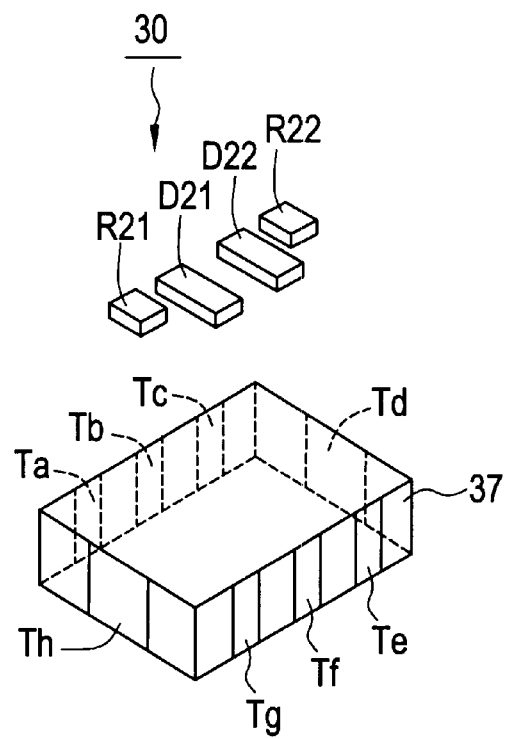
FIG. 6 is a partially exploded perspective view of the phase shifter in FIG. 5.

FIG. 6 is a partially exploded perspective view of the phase shifter in FIG. 5. The phase shifter 30 is provided with a ceramic substrate 37 having the first and second transmission lines 31 and 32 defining the first comb-line 33 and the third and fourth transmission lines 34 and 35 defining the second comb-line 36 incorporated therein, but not shown.

The diodes D21 and D22 and the resistors R21 and R22 are mounted on the top surface of the ceramic substrate 37.

The external terminals $T_a$ to $T_h$ are arranged to extend from the corresponding side surfaces to the bottom surface of the ceramic substrate 37.

At this time, the external terminals $T_a$, $T_c$, $T_e$, and $T_g$ function as the input terminal $P_i$, output terminal $P_o$, and control terminals $V_{c12}$ and $V_{c11}$, respectively, and the external terminals $T_b$, $T_d$, $T_f$, and $T_h$ function as the ground terminals.

FIGS. 7A to 7F and FIGS. 8A to 8C are top and bottom views of each of the sheets constitute the ceramic substrate of the attenuator in FIG. 6. The ceramic substrate 37 is formed by sequentially laminating first to eighth sheet layers 37a, 37b, 37c, 37d, 37e, 37f, 37g and 37h including low-temperature baked ceramic preferably having principal components of barium oxide, aluminum oxide, and silica, which are burnable between e.g., about 850° and about 1000°, and by baking the sheets.

Figure 7A:
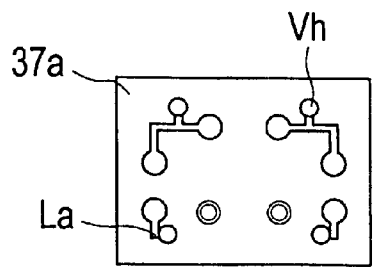
FIGS. 7A, 7B, 7C, 7D, 7E and 7F are top views of first to sixth sheet layers which constitute the ceramic substrate of the phase shifter in FIG. 6.
Figure 7B:
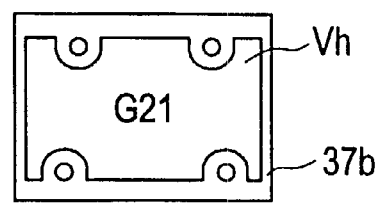
Figure 7C:
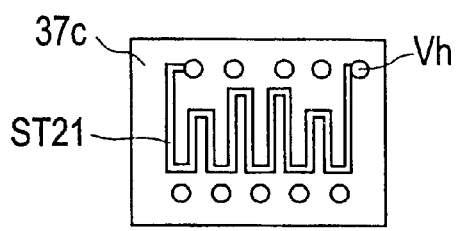
Figure 7D:
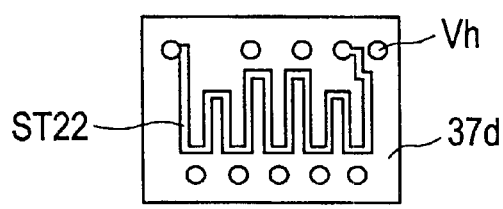
Figure 7E:
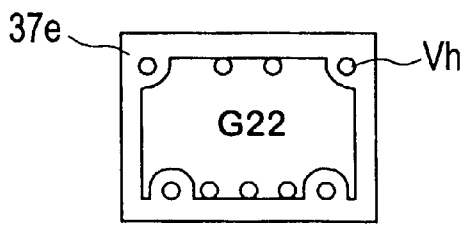
Figure 7F:
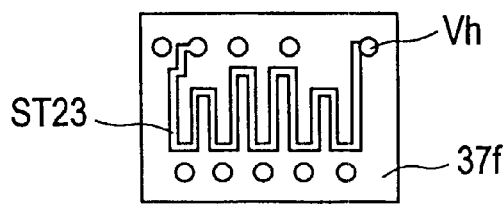
Figure 8A:
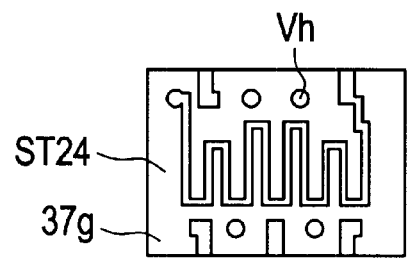
FIGS. 8A 8B and 8C are top views of seventh and eighth sheet layers and a bottom view of the eighth sheet layer which constitute the ceramic substrate of the phase shifter in FIG. 6.
Figure 8B:
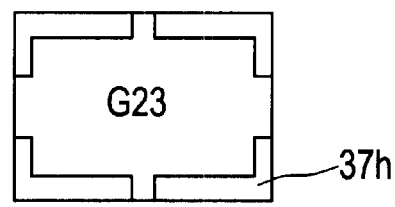
Figure 8C:
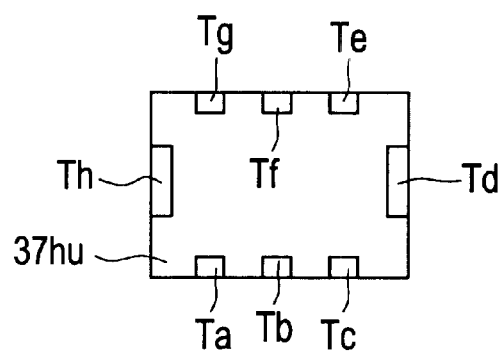

The land $L_a$ for implementing the varicap diodes D21 and D22 and the resistors R21 and R22 is disposed on the top surface of the first sheet layer 37a shown in FIG. 7A. Ground electrodes G21. G22 and G23 are provided on the top surfaces of the second, fifth, and eighth sheet layers 37b, 37e, and 37h, respectively.

Furthermore, strip-line electrodes ST2I, ST22, ST23 and ST24 are provided on the top surfaces of the third, fourth, sixth, and seventh sheet layers 37c, 37d, 37f, and 37g, respectively. The external terminals $T_a$, $T_b$,$T_c$,$T_d$,$T_e$,$T_f$,$T_g$, $T_h$ are provided on the bottom surface (in FIG. 8C, marked with "hu") of the eighth sheet layer. In addition, the first to seventh sheet layers 37a to 37g are provided with the via-hole electrodes $V_h$ so that the via-hole electrodes $V_h$ penetrate through each of the sheet layers 37a to 37g.

At this time, the strip-line electrode ST21 constitutes the second transmission line 32 defining the first comb-line 33, the strip-line electrode ST22 constitutes the first transmission line 31 defining the first comb-line 33, the strip-line electrode ST23 constitutes the fourth transmission line 35 defining the second comb-line 36, and the strip-line electrode ST24 constitutes the third transmission line 34 defining the second comb-line 36. The first to fourth transmission lines 31, 32, 33, 34, and 35, the varicap diodes D21 and D22, and the resistors R21 and R22 are connected by the via-hole electrodes $V_h$ inside the ceramic substrate 37.

According to the phase shifter in the fourth preferred embodiment, since the varicap diodes are connected between the other ends of the third and fourth transmission lines defining the second comb-line and the corresponding grounds, variable control of the applied voltage applied to the varicap diodes enables the capacitances of these varicap diodes to be controlled in a variable manner. Consequently, the impedances of the varicap diodes can be controlled in a variable manner. This can realize variable control of the phase of the high-frequency signal transmitted via the first and second comb-lines from the input terminal to the output terminal of the phase shifter.

Since the first and second comb-lines and the varicap diodes constitute the phase shifter, the construction of the phase shifter is greatly simplified. As a result of this, miniaturization and reduction in manufacturing cost of the phase shifter are achieved.

Furthermore, since the ceramic substrate obtained by laminating a plurality of ceramic sheet layers is provided and the copper strip electrodes constituting the comb-line are incorporated in the ceramic substrate, the "wavelength reduction effect" caused by the ceramic substrate and reduction in copper loss allow the phase shifter to be adapted for use in the high frequency band of 1 GHz or above.

Since the first comb-line and the second comb-line are arranged to be overlapped in the vertical direction of the ceramic substrate, the mounting area of the phase shifter is greatly decreased. In the present preferred embodiment, for example, the mounting area is approximately 4.9×3.2 mm².

Figure 9:
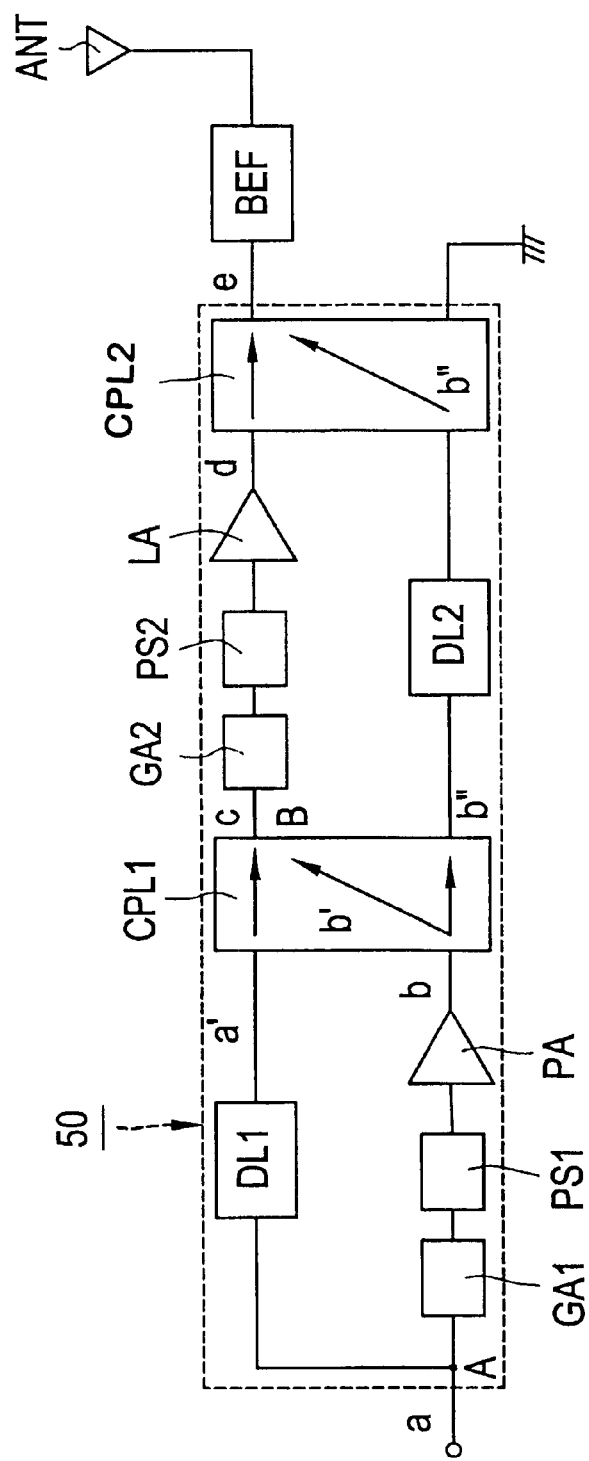
FIG. 9 is a block diagram of a portable phone, which is a wireless communication device.
Figure 10:
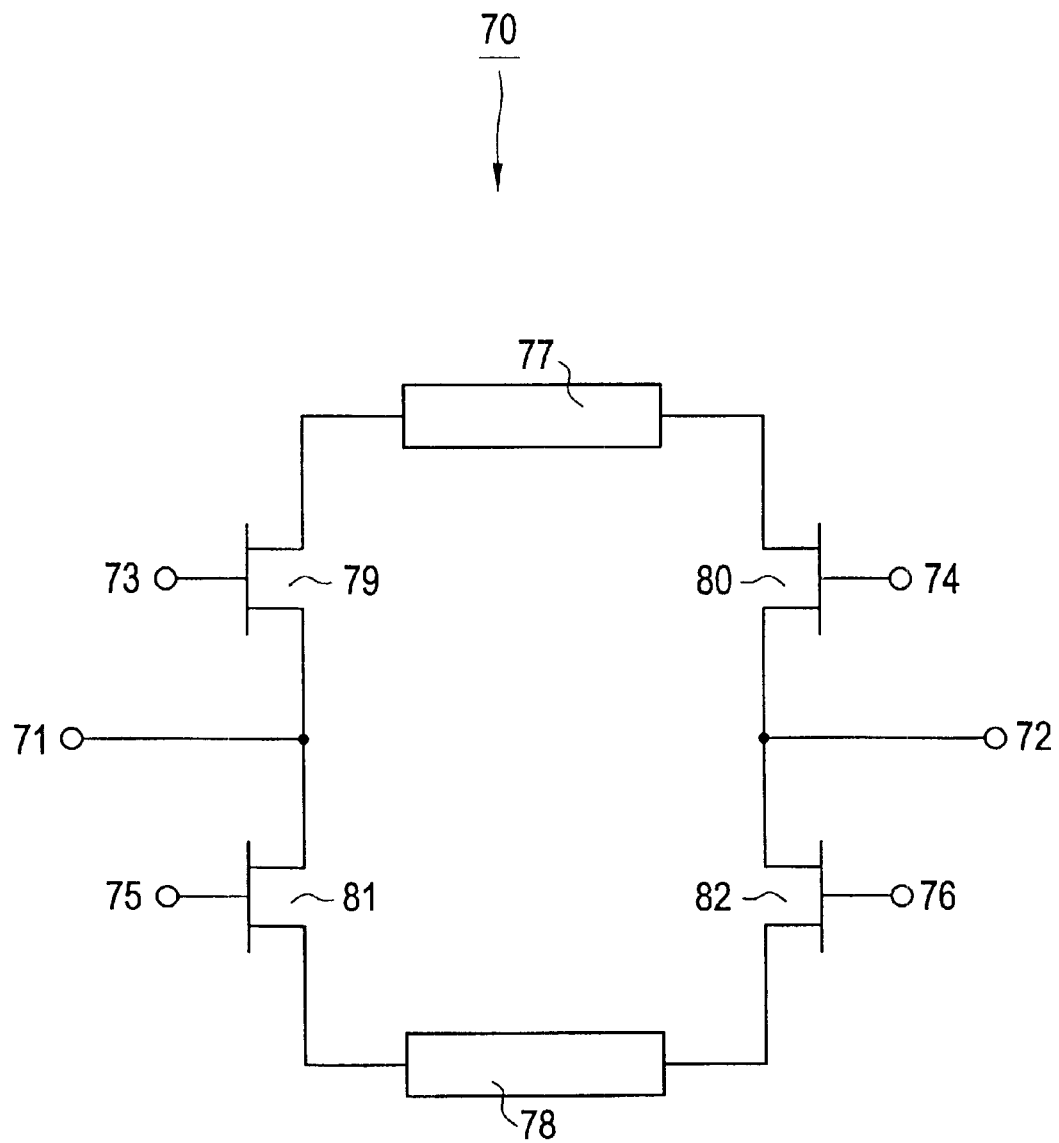
FIG. 10 is a circuit diagram showing a conventional phase shifter.

FIG. 9 is a block diagram of a common-amplification amplifier used in a base station that is one of the wireless communication devices according to yet another preferred embodiment of the present invention. This common-amplification amplifier 50 includes a high-powered amplifier PA provided in a main signal line, a low-noise amplifier LA, delay lines DL1 and DL2, couplers CPL1 and CPL2, phase shifters PS1 and PS2, and attenuators GA1 and GA2.

The operation of the common-amplification amplifier 50 is described. An input signal "a" is branched at a point A: One of the branched signals is input via the attenuator GA1 and the phase shifter PS1 into the high-powered amplifier PA in which it is amplified into a signal "b" having an IMD (Intermodulation Distortion); and the other is caused to be synchronized with the timing of the signal "b" by the delay line DL1 (signal "a'") and is input into the coupler CPL1.

The signal "a'" and a part of the signal "b" (signal "b'") undergoing combination of the amplitudes thereof and reversal of the phases thereof are output to the output terminal B of the coupler CPL1. Therefore, a signal (signal "c") having only the IMD is obtained by canceling a desired signal. The signal "c" is input into the low-noise amplifier LA via the attenuator GA2 and the phase shifter PS2. When the signal "c" is amplified at the low-noise amplifier LA, the amplitude thereof is adjusted so as to be equal to the IMD of a signal "b''" (signal d).

The signal "b''" is caused to be synchronized with the timing of the signal "d" by the delay line DL2. When the signal "b''" and signal "d" are combined at the coupler CPL2, a signal "e" having only a desired signal is obtained in which IMD is cancelled. This signal "e" is output via a band elimination filter BEF from an antenna ANT of the base station.

In such a common-amplification amplifier 50, in order to obtain a signal having an accurate phase, the phase shifters PS1 and PS2 which can continuously vary the phase of the input signal are used.

In the common-amplification amplifier 50 having such a construction, using the portable phase shifters 10, 20, and 30 shown in FIGS. 1, 4, and 5 as the phase shifters PS1 and PS2 can realize a small base station having a desirable transmission characteristic.

In the first to third preferred embodiments, ends of the first and second transmission lines constituting the comb-line are preferably directly connected to the input terminal or the output terminal. Alternatively, the ends of the first and second transmission lines may be connected via a coupling capacitor to the input terminal or the output terminal.

Although the preferred embodiments are described as having control terminals for applying the applied voltages to the varicap diodes which are the variable-capacitance diodes connected to the cathodes of the varicap diodes via the resistors, the control terminals may be directly connected to the varicap diodes without the resistors.

Although the preferred embodiments are described as having the control terminals for applying the applied voltages to the varicap diodes which are the variable-capacitance diodes are provided in ends of the first to fourth transmission lines constituting the comb-lines, the control terminals may be provided in any portion of the first to fourth transmission lines.

Although the preferred embodiments are described as having the varicap diodes define the variable-capacitance diodes, use of varactor diodes also achieves the same effect.

Although the preferred embodiments are described as having the variable-capacitance diodes connected between the first to the fourth transmission lines and the corresponding grounds so that the cathodes thereof are on the other end sides of the first to fourth transmission lines, the diodes may be connected so that the anodes thereof are on the other end sides of the first to fourth transmission lines. In this case, by gradually increasing the negative voltage from 0V as the applied voltage applied to the anode side of the variable-capacitance diode, the capacitance of the variable-capacitance diode is gradually increased.

In the third preferred embodiment, although it is described that two comb-lines are connected, three or more comb-lines may be connected. In this case, the attenuator can be further miniaturized in accordance with increase in the number of comb-lines.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A phase shifter comprising:

a first comb-line defined by first and second transmission lines electromagnetically coupled with each other;

a second comb-line defined by third and fourth transmission lines electromagnetically coupled with each other; and variable-capacitance diodes respectively connected to the third and fourth transmission lines defining said second comb-line, wherein:

a first end of the first transmission line is connected to an input terminal;

a second end of the second transmission line is connected to an output terminal;

the variable-capacitance diodes are respectively connected between first ends of the third and fourth transmission lines and the corresponding grounds; and a second end of the first transmission line and a second end of the second transmission line are connected to a second end of the third transmission line and a second end of the fourth transmission line, respectively.

2. A phase shifter according to claim 1, further comprising a ceramic substrate having a laminated body of a plurality of sheet layers including ceramic material, wherein strip electrodes that defines said first and second comb-lines, are incorporated in said ceramic substrate, and the variable-capacitance diodes are mounted in said ceramic substrate.

3. A wireless communication device comprising a phase shifter according to claim 1.

4. A wireless communication device according to claim 3, further comprising a plurality of resistors, wherein the variable-capacitance diodes are respectively connected in parallel with the plurality of resistors.

5. A wireless communication device according to claim 4, wherein a first parallel circuit including one of the variable-capacitance diodes and one of the resistors, and a second parallel circuit including another of the variable-capacitance diodes and another of the resistors, are respectively connected between the second ends of the first and second transmission lines and the corresponding grounds.

6. A wireless communication device according to claim 3, further comprising a ceramic substrate having a laminated body of a plurality of sheet layers including ceramic material, wherein strip electrodes that defines said first and second comb-lines are incorporated in said ceramic substrate, and the variable-capacitance diodes are mounted in said ceramic substrate.

7. A phase shifter according to claim 1, further comprising a plurality of resistors, wherein the variable-capacitance diodes are respectively connected in parallel with the plurality of resistors.

8. A phase shifter according to claim 7, wherein a first parallel circuit including one of the variable-capacitance diodes and one of the resistors, and a second parallel circuit including another of the variable-capacitance diodes and another of the resistors, are respectively connected between the second ends of the first and second transmission lines and the corresponding grounds.

* * * * *